(12) United States Patent
Lin

(10) Patent No.: US 7,280,361 B1
(45) Date of Patent: Oct. 9, 2007

(54) CLAMPING TOOL

(75) Inventor: Sheng-Huang Lin, Taipei (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 0 days.

(21) Appl. No.: 11/419,972

(22) Filed: May 23, 2006

(51) Int. Cl.
*H05K 7/20* (2006.01)

(52) U.S. Cl. ........................ 361/704; 361/710; 361/719; 165/80.3; 165/185; 24/453; 24/458; 24/459; 24/518

(58) Field of Classification Search ................ 361/704, 361/710, 719; 165/80.3, 185; 24/453, 458, 24/459, 518
See application file for complete search history.

(56) References Cited

U.S. PATENT DOCUMENTS

| 5,771,960 | A   | * | 6/1998  | Lin ........................... 165/80.3 |
| 5,860,195 | A   | * | 1/1999  | Wang ........................... 24/459 |
| 6,256,846 | B1  | * | 7/2001  | Lee ............................. 24/459 |
| 6,373,704 | B1  | * | 4/2002  | Chen ......................... 361/704 |
| 6,392,889 | B1  | * | 5/2002  | Lee et al. ................... 361/704 |
| 6,754,080 | B2  | * | 6/2004  | Lee et al. ................... 361/710 |
| 6,795,317 | B1  | * | 9/2004  | Liu ............................. 361/704 |
| 6,977,816 | B2  | * | 12/2005 | Lee et al. ................... 361/704 |
| 7,099,156 | B2  | * | 8/2006  | Chen et al. ................. 361/719 |
| 7,215,550 | B1  | * | 5/2007  | Yang et al. ................. 361/704 |
| 2004/0190262 | A1 | * | 9/2004 | Lai et al. .................... 361/704 |
| 2005/0144764 | A1 | * | 7/2005 | Lin ............................. 24/459 |
| 2006/0171125 | A1 | * | 8/2006 | Yu et al. ..................... 361/710 |

\* cited by examiner

*Primary Examiner*—Courtney Smith

(57) ABSTRACT

A clamping tool for securing a heat sink to a holding frame, which is disposed on top of a central processing unit (CPU), includes a support arm, a press handle, an elastic member, and an engaging arm. The support arm provides a horizontal arm member and an elastic vertical arm member being attached to an end with a lower hook end thereof engaging with a lock hole disposed at a lateral side of the holding frame. An end of the press handle has a round projection with an eccentric pivotal hole. The elastic member is a bow shaped plate being disposed under at an end of the horizontal arm member. The engaging arm has an upper end with a pivotal hole and a lower bent end and the upper end passes through the elastic member and pivotally fits with the press handle by way of a pivotal shaft passing through the pivotal hole and the eccentric pivotal hole. The lower bent end engages with another lock hole at another lateral side of the holding frame. whereby, the press handle is stirred, the heat sink is capable of being clamped against the CPU due to the elastic member providing a capability to bias the engaging arm toward the holding frame.

4 Claims, 2 Drawing Sheets

CLAMPING TOOL

BACKGROUND OF THE INVENTION

1. Field of the Invention

The present invention is related to a condensation device for a fuel cell and particularly to a condensation device, which is capable of guiding heat outward and condensing high heat and humidity gas produced while the fuel cell being in operation without consuming extra energy under conditions of limited volume of the fuel cell and limited space available for the condensation device.

2. Brief Description of the Related Art

It is known that various portable electronic information products have been developed due to technologies related to electronics, communication and internet progressing rapidly. Usually, the portable products need batteries as power source for supplying electric energy. But, the batteries have limited capacities and become exhausted after being used a period of time. In order to overcome the preceding deficiency of the ordinary batteries, a method for making fuel cell has been disclosed in Taiwanese Patent No. 1241048. The fuel in the cell is a methyl alcohol solution or pure methyl alcohol and a chemical reaction is processed to transfer chemical energy to electric power output. Comparing to the conventional power generation, methyl alcohol cell provides advantages such as low pollution, high energy intensity and higher energy transfer density.

When the fuel battery is in operation, preferable effect can be reached under conditions of proper work temperature and humidity. Thus, structure of the fuel cell has passages for gas and often needs active cooling component such as cooling chips or guiding heat pipes for reducing temperature in addition to having cooling passages for maintaining the fuel cell at a proper temperature. However, gross power consumption of all components in the fuel cell system is an important factor needed to consider to the entire design. How to design a cooling device with no energy consumption and high efficiency is worth us to care. Besides, how to recycle and reuse moisture in the high heat and humidity gas produced during the fuel cell being in operation is a problem worth us to solve too.

SUMMARY OF THE INVENTION

Accordingly, an object of the present invention is to provide a condensation device for a fuel cell, which is capable of condensing high heat and humidity gas produced at the time of the fuel cell in operation without consuming extra energy.

Another object of the present invention is to provide a condensation device for a fuel cell in which a turnabout path is defined to increase heat dissipating surface area for the gas with high heat and humidity such that cooling effect is promoted greatly.

A further object of the present invention is to provide a condensation device for a fuel cell with which the gas with high heat and humidity can be reduced temperature thereof and condense moisture inside as water by means of the gas impinging the condensation device such that the gas can be dried and the water can be recycled by the fuel battery.

A further object of the present invention is to provide a condensation device for a fuel cell in which a fan can be employed to remove the dried gas for increasing air flow and enhancing effect of heat dissipation and it avoids the fan being subjected to the high heat and humidity gas for enhancing reliability and life span of the fan.

In order to achieve the preceding objects, a condensation device for a fuel battery according to the present invention provides a condensation main member. The condensation main member has an opening at two lateral sides thereof and one of the lateral sides is joined to a fuel battery for a gas entering via one of the openings and removing via another one of the openings. A turnabout path is defined in the condensation main member for increasing heat dissipating surface area being impinged by the gas such that heat energy of the gas conducts to the outer surface of the condensation main member to perform heat exchange with outside air and moisture in the gas is reduced temperature thereof to condense as water for being recycled and reused.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
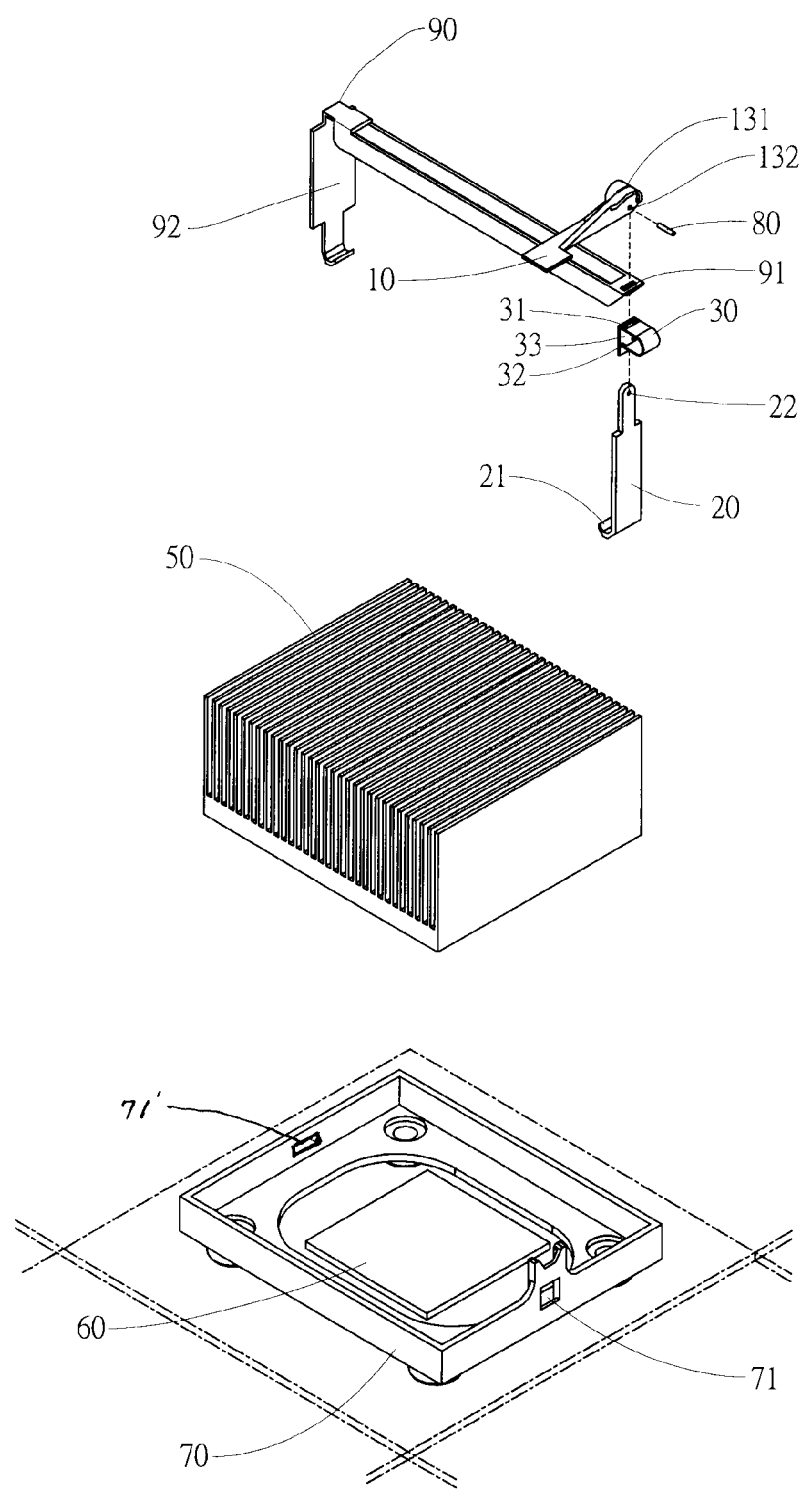
FIG. 1 is an exploded perspective view of the preferred embodiment of a clamping tool according to the present invention.
Figure 2:
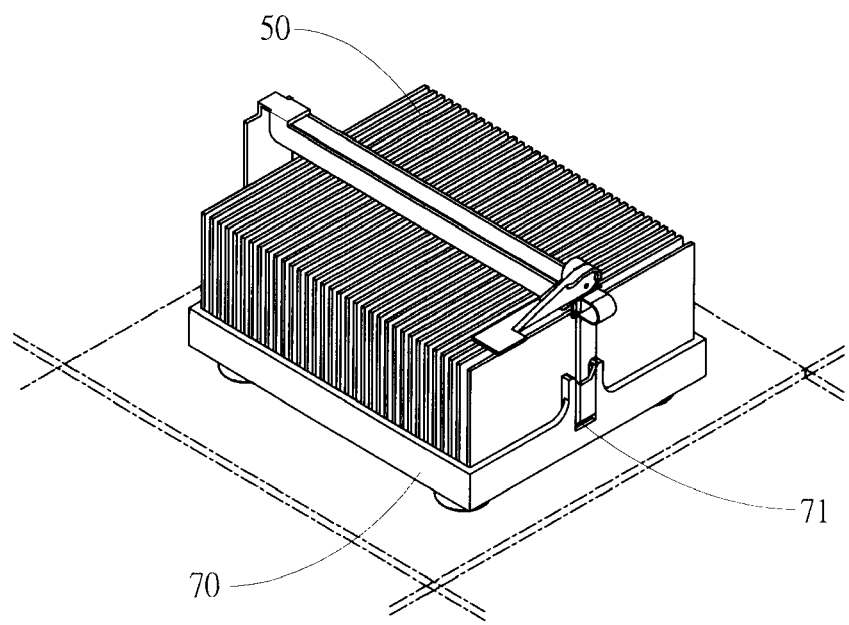
FIG. 2 is a assembled perspective view of FIG. 1.
Figure 3:
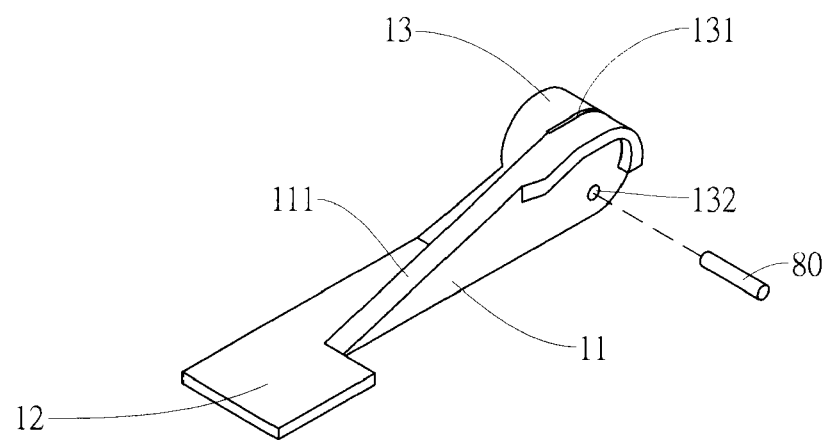
FIG. 3 is a perspective view illustrating the press handle of the clamping tool shown in FIG. 1.

Referring to FIGS. 1, 2 and 3, a clamping tool according to the present invention includes a press handle 10, an engaging arm 20, an elastic member 30 and an inversed L shaped support arm 90. The press handle 10 provides a main part 11, which has a rib part 111 extending laterally from almost a half section of the periphery thereof for reinforcing structural strength. An end of the main part 11 is a flat stir part 12 for being operated by the user and another end thereof has a round projection 13 next to the rib 131 with an elongated opening 131 between the round projection 13 and the rib 131 for being inserted with an end of the engaging arm 20. The round projection 13 has an eccentric hole 132 to align with a shaft hole 22 at the upper end of engaging arm 20 inserting through the opening 131. A pivotal shaft 80 passes through the eccentric hole 132 to pivotally engages with the shaft hole 22 such that the press handle 20 can be stirred clockwise or counterclockwise to move vertically.

The horizontal arm member of the support arm 90 has a through hole 91 at the free end thereof for being passed through with the upper end of the engaging arm 20 before the upper end inserting into the elongated openings 131 of the press handle 10. Hence, when the press handle 10 is stirred, the engaging arm is capable of clamping an object under a condition of being held by the support arm 90.

The engaging arm 20 has a slightly bent lock end 21 to detachably insert into an engaging hole 71 at a lateral side of a holding frame 70 next to the CPU 60. The support arm 90 further has a vertical arm member 92 at the other end of the horizontal arm member with a lower hook end for detachably engaging with another engaging hole 71' at another lateral side of the holding frame 70 opposite to the engaging hole 71 such that a heat sink 50 can fixedly attached to the CPU 60. When the press handle 10 is moved downward with the round projection 13 at least partly contacting or conflicting the support arm 90, the lock end 21 of the engaging arm 20 is able to engage with the engaging hole 71 and to secure the heat sink 50 against the CPU 60.

In this way, heat resistance between the heat sink 50 and the CPU 60 can be reduced significantly so as to enhance effect of heat dissipation.

It is appreciated that the special feature of the invention is in that the engaging arm 20 is capable of fitting with the elastic member 30 such that it avoids the engaging arm 20 to occur swinging and guides the engaging arm 20 to engage with the holding frame 70. The elastic member 30 can be a bow, C or horizontal U shaped plate as shown in FIG. 1 or other shapes. The elastic member 30 is provide with a slot 31 for the engaging arm 20 being able to insert through and enhance steadiness of the engaging arm 20 while the engaging arm 20 engages with lock hole 71. Besides, an end of the elastic member 30 has a clip part 32 to increase holding force for retain the engaging arm 20. Another end of the elastic member 30 extends vertically a stop part 33 to contact the heat sink 50 for damping foreign force exerting the engaging arm 20 and avoiding shock resulting from the foreign force loosening parts of the clamping tool.

While the invention has been described with referencing to a preferred embodiment thereof, it is to be understood that modifications or variations may be easily made without departing from the spirit of this invention, which is defined by the appended claims.

What is claimed is:

1. A clamping tool for securing a heat sink to a holding frame, which is disposed on top of a central processing unit (CPU), comprising:

a support arm, providing a horizontal arm member with a first end and a second end and an elastic vertical arm member being attached to the second end with a lower hook end thereof engaging with a lock hole disposed at a lateral side of the holding frame and the first end having a first slot;

a press handle, providing an elongated main part, which has a rib part extending laterally from almost a half section of the periphery thereof, an end of the main part being flat for being stirred easily, another end of the main part having a round projection next to the rib with an elongated opening between the round projection and the rib and the projection having an eccentric pivotal hole;

an elastic member, being a bow shaped plate, being disposed below the first end of the horizontal arm member with a second slot aligning with the first slot; and an engaging arm; having an upper end with a pivotal hole and a lower bent end, the upper end passing through the second and first slots and pivotally fitting with the press handle by way of a pivotal shaft passing through the pivotal hole and the eccentric pivotal hole, and the lower bent end engaging with another lock hole at another lateral side of the holding frame;

whereby, the press handle is stirred, the heat sink is capable of being clamped against the CPU due to the elastic member providing a capability to bias the engaging arm toward the holding frame.

2. The clamping tool as defined in claim 1, wherein an end of the elastic member extends a clip part and another end of the elastic member extends a stop p art.

3. The clamping tool as defined in claim 1, wherein elastic member has a shape of "C".

4. The clamping tool as defined in claim 1, wherein elastic member has a shape of horizontal "U".

* * * * *